(12) United States Patent
Anderson et al.

(10) Patent No.: US 7,631,991 B2
(45) Date of Patent: Dec. 15, 2009

(54) BRIGHTNESS ENHANCEMENT OF LED USING SELECTIVE RAY ANGULAR RECYCLING

(75) Inventors: Duncan J. Anderson, Sleepy Hollow, NY (US); Hans Zou, Windsor, NJ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 425 days.

(21) Appl. No.: 11/575,702

(22) PCT Filed: Sep. 22, 2005

(86) PCT No.: PCT/IB2005/053147

§ 371 (c)(1),
(2), (4) Date: Mar. 21, 2007

(87) PCT Pub. No.: WO2006/035391

PCT Pub. Date: Apr. 6, 2006

(65) Prior Publication Data

US 2009/0185384 A1      Jul. 23, 2009

Related U.S. Application Data

(60) Provisional application No. 60/614,718, filed on Sep. 30, 2004.

(51) Int. Cl.
*F21V 5/00* (2006.01)

(52) U.S. Cl. .................. 362/326; 362/308; 362/293; 257/98

(58) Field of Classification Search ................. 362/326, 362/327, 341, 307, 308, 311.02, 293, 317, 362/257, 800; 257/79, 98, 100, 103
See application file for complete search history.

(56) References Cited

U.S. PATENT DOCUMENTS

| 6,774,404 | B2 * | 8/2004 | Imai | 257/98 |
| 6,809,342 | B2 * | 10/2004 | Harada | 257/79 |
| 7,070,300 | B2 * | 7/2006 | Harbers et al. | 362/231 |
| 2002/0080615 | A1 | 6/2002 | Marshall et al. | |
| 2004/0145895 | A1 * | 7/2004 | Ouderkirk et al. | 362/260 |
| 2005/0002194 | A1 * | 1/2005 | Kikuchi et al. | 362/300 |

FOREIGN PATENT DOCUMENTS

| EP | 1213773 A | 6/2002 |
| WO | 2004025741 A | 3/2004 |

* cited by examiner

*Primary Examiner*—Bao Q Truong

(57) ABSTRACT

Light that is emitted from an LED chip at a first angle of incidence or less relative to the LED chip is permitted to leave the LED package. Light emitted from the LED chip at an angle of incidence greater than that is kept from leaving the LED package and is recycled back within the LED package. The recycled light is reemitted from the LED package after its angle of incidence relative to the LED chip has been changed, for example by passing it through a diffuser.

11 Claims, 3 Drawing Sheets

BRIGHTNESS ENHANCEMENT OF LED USING SELECTIVE RAY ANGULAR RECYCLING

This application is directed to LED light sources in general, and LED light sources for projection engines and projection displays image processing and, more particularly, to image processing involving motion compensation.

Leaders in manufacturer of high power LED sources have produced high brightness LED sources in the course of improving the maximum current densities and heat-sinking for such sources. The light is emitted in random (Lambertian) directions from such sources and collection optics have been designed to preserve the brightness of the source and collimate the light. However, the brightness of such LEDs is marginal for use as sources for projection systems and there is need for enhancement of LED apparent brightness. Since an LED chip emits light in all directions, a significant portion of light cannot be collected directly for many applications, which have limited light collection capability.

Therefore, it is desirable to have a method to tailor LED output distribution with minimal loss in total output flux. It is also desirable to enhance the brightness of an LED source, making it viable to produce projection systems based on such sources. It is also desirable to explore ways of tailoring the output distribution of an LED to better match a light collecting optics with minimal loss in total output flux.

To address one or more of these concerns, in one aspect of the invention an LED package includes an LED chip, an edge filter that transmits light emitted from the LED chip having a first angle of incidence or less relative to the LED chip, and reflects light emitted from the LED chip having an angle of incidence relative to the LED chip greater than the first angle of incidence, and a diffuser disposed to receive light reflected from the edge filter.

In another aspect of the invention, an LED package includes an LED chip, angle dependent light recycling means for transmitting light emitted from the LED chip having a first angle of incidence or less relative to the LED chip, and reflecting light emitted from the LED chip having an angle of incidence relative to the LED chip greater than the first angle of incidence, and a diffuser disposed to receive light reflected from the edge filter.

One way of describing a method for accomplishing the invention is that light that is emitted from an LED chip at a first angle of incidence or less relative to the LED chip is permitted to leave the LED package. Light emitted from the LED chip at an angle of incidence greater than that is kept from leaving the LED package and is recycled back within the LED package. The recycled light is reemitted from the LED package after its angle of incidence relative to the LED chip has been changed, for example by passing it through a diffuser.

The invention may be better explain with the help of the following drawings, of which:

In projection systems employing microdisplays there is an optical aperture (or etendue) defined by the area of the display and the numerical aperture of the magnification optics. The objective of any illumination system is to provide the maximum optical flux within this aperture and hence to produce the brightest projected image. A LED source emits light in random directions from the source chip and often light is not collected within the aperture of the projection system (and hence wasted). By recycling light that would otherwise be wasted it is possible to increase the apparent brightness of the LED by redirect those light rays into the light collection aperture.

Figure 1:
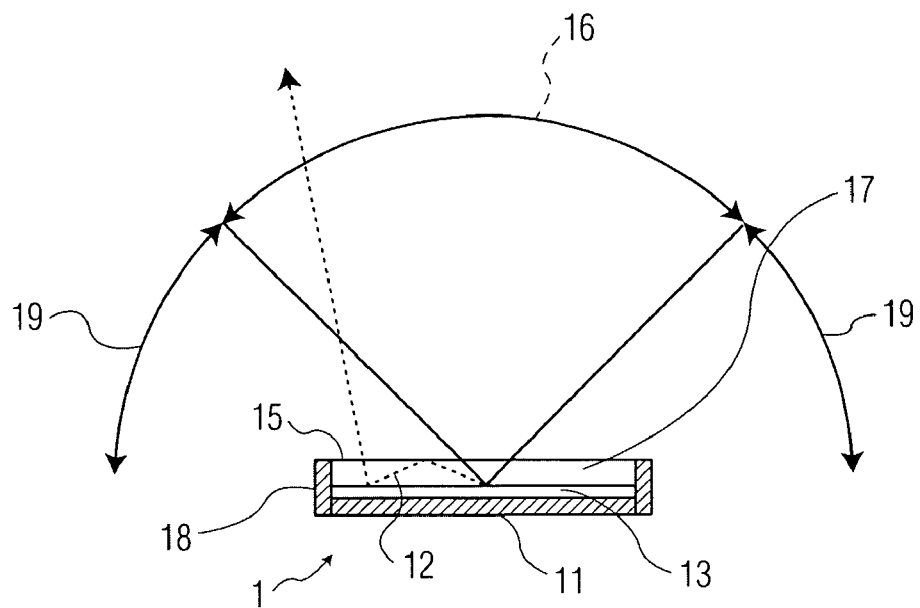
FIG. 1 illustrates an LED chip according to one possible embodiment of the invention.

FIG. 1 illustrates an LED chip package 1 that includes an LED chip 11, a diffusing layer (diffuser) 13 and a dichroic mirror 15 above. The function of the dichroic mirror is to reflect light whose angle of incidence falls outside a designed transmission cone 16 (i.e. numerical aperture of projection system). To achieve this a dichroic cut-off edge filter 17 whose transmission edge shifts to shorter wavelengths as the angle of incidence of the light increases is placed above the chip. An additional mirror 18 can be placed at the sides of the LED package 1. The emission spectrum of the LED and transmission of the filter are matched to enable reflection of the high angle of incidence rays but still transmit rays close to on axis radiation. The reflected light is recycled through the diffuser 13 (or possibly both the diffuser and LED chip) to encounter the dichroic mirror 15 for a second time; hence a fraction of this recycled light 12, which if emitted without reflection would have fallen within what could be called a reflected cone 9 is now within the transmission cone 16. Recycling will occur multiple times until the light has been scattered into the transmission cone of the filter, however absorption losses in the recycle path will compound to reduce the optical flux provided by each successive recycle path. In addition to the edge filter design band-pass filters can be used whose transmission window is matched to the LED wavelength; both the low and high wavelength filter edge shifts with increasing angle of incidence resulting in an increasing reflection of the LED radiation as a function of the illumination angle of incidence.

In FIG. 1 the LED chip 11 radiates light into a half-hemisphere (Lambertian distribution). Additional dielectric mirror and diffuser coatings combine to increase the brightness of light emitted. The cut-off wavelength of the dielectric mirror shifts to shorter wavelengths as the angle of incidence of the illumination increases.

Figure 2:
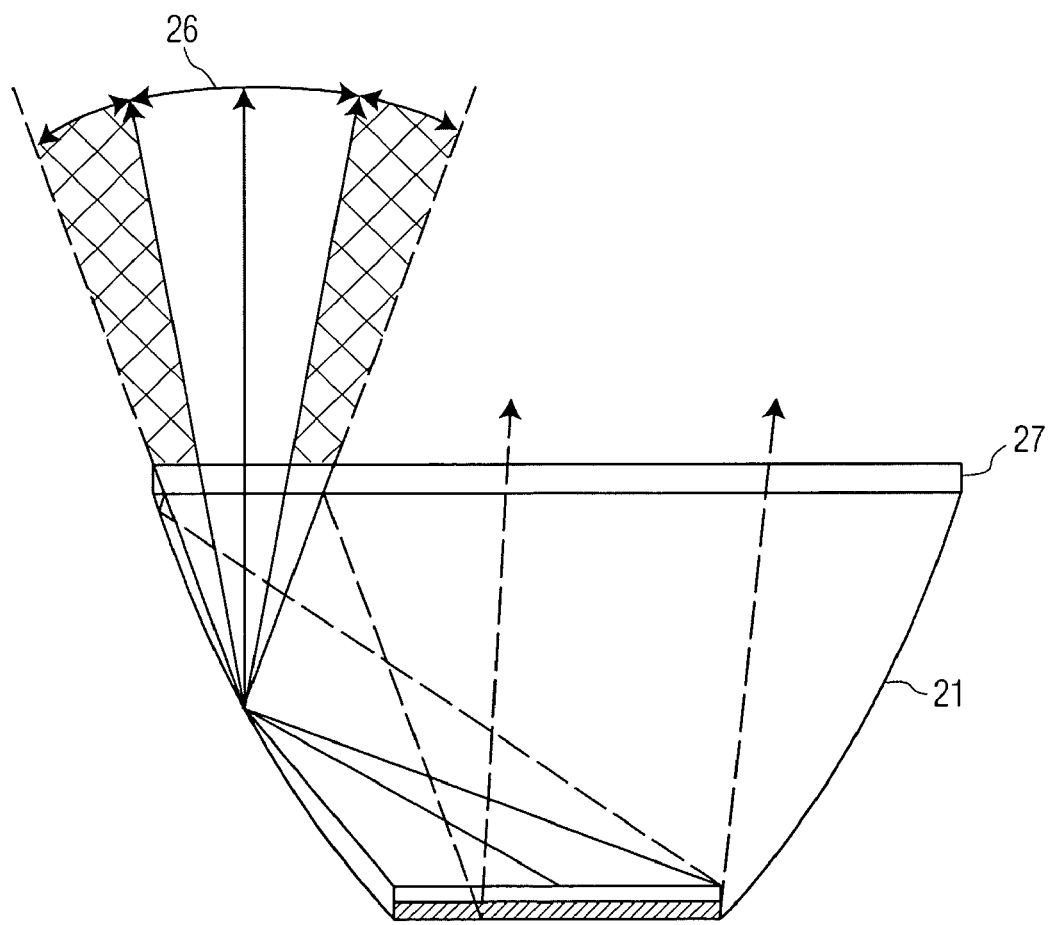
FIG. 2 illustrates an LED chip according to another possible embodiment of the invention.
Figure 3A:
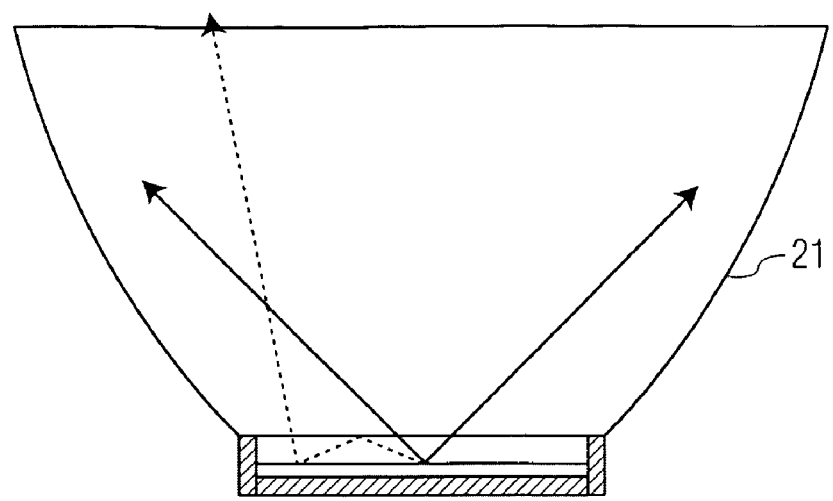
FIG. 3A illustrates collimation of light from an LED chip using a Compound Parabolic Concentrator (CPC).
Figure 3B:
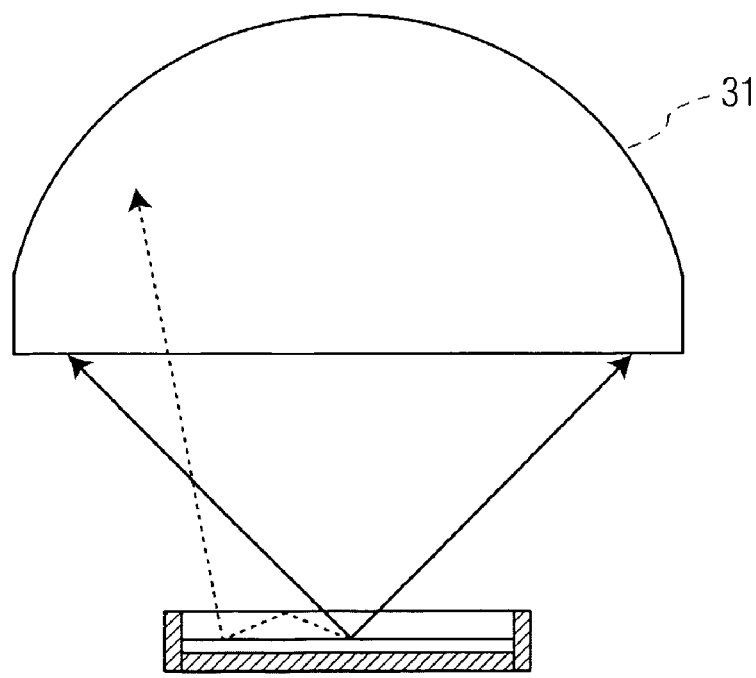
FIG. 3B illustrates use of an LED with an external optic for collimation/collection.

Additionally, the dichroic filter may be placed after a collimation optic, which is integrated into an LED package. In FIG. 2 a Compound Parabolic Concentrator (CPC) 21 collimates light rays randomly emitted from the LED chip by reflecting (Total Internal Reflection) them from the edge of the optic. Once again, rays with angles determined to be larger than the dichroic filter cut-off will be reflected and redirected to the LED chip and diffuser. Scattering of this light directs a fraction of the light into the transmission cone 26 of the dichroic filter 27. A CPC collimator 21 is shown here, although other collimation/collection optics are possible and may even be a combination of refractive and reflective optics. Furthermore, the LED chip whose light shown in FIG. 1 could be further collimated by a CPC 21 or lens 31 and is shown schematically in FIGS. 3A and 3B. The recycled light results in a narrowing of the cone angle emitted from the LED, hence conventional optics such as aspherical lenses may be used to collect the light. The edge profile of the CPC optic must be modified to collect the new range of ray angles radiated by the LED.

Figure 4A:
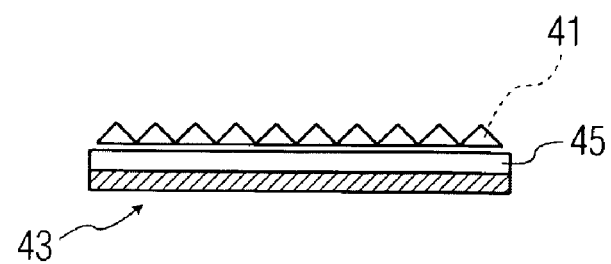
FIG. 4A shows a Brightness Enhancement Film (BEF).
Figure 4B:
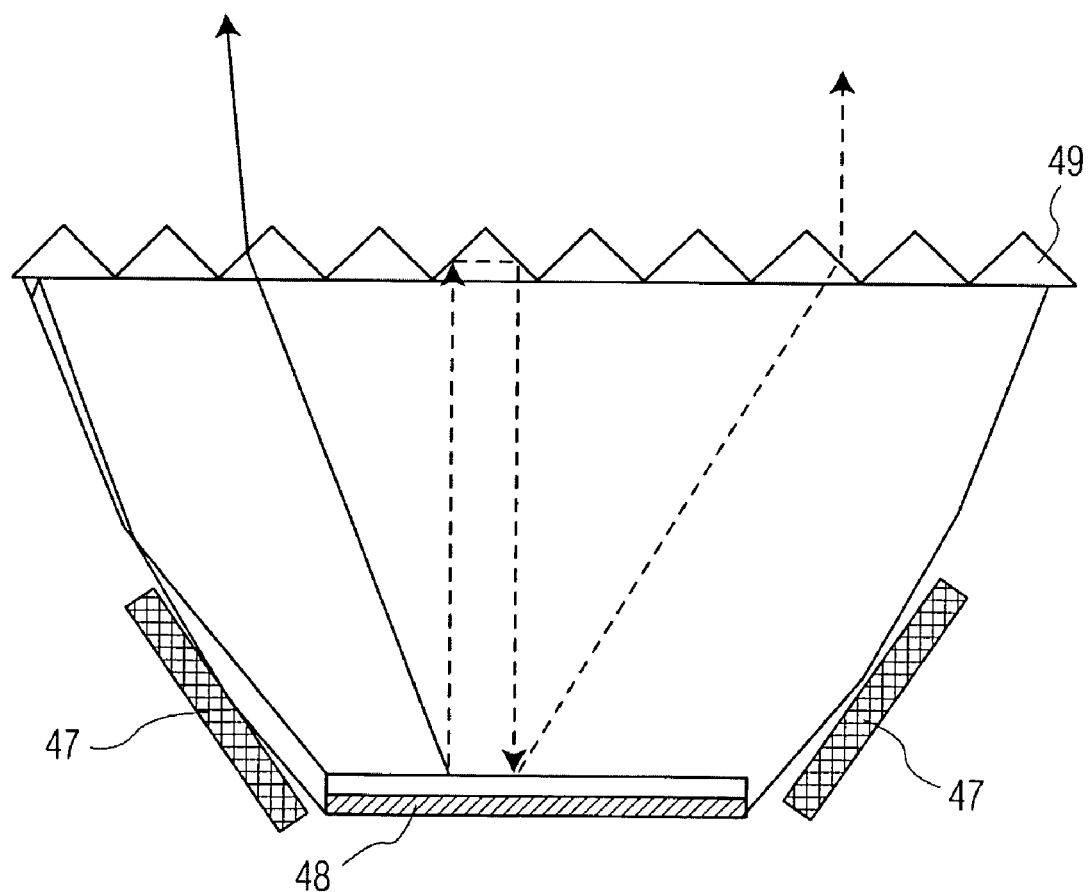
FIG. 4B illustrates use of a Brightness Enhancement Film (BEF) with an LED.

In addition to dichroic cut-off filters there are other optics that can be used to select a range of ray angles and re-direct the light back to the LED chip. One such structure is based upon triangular grooved arrays and is shown in FIGS. 4A and 4B. Such structures are manufactured by 3M under the tradename BEF (Brightness Enhancement Film) and are commonly used in the backlight of direct view liquid crystal displays to collimate the light. The optical film 43 shown in FIG. 4A has a prismatic film 41 placed on top of a diffuser 45. It reflects light over a range of angles (in one plane) close to the normal of the film (by Total Internal Reflection); for larger angles of incidence the light is refracted by the BEF towards the normal of the film. Hence selective reflection and recycling of light is possible with such optical structures. One advantage of such optics is that the reflected light is relatively insensitive to the wavelength of the LED, as compared to the technique illustrated in FIG. 1; variation in the wavelength of a LED can occur from batch to batch and additionally dynamic shifts in the wavelength occur when the LED is driven at high current densities. This can lead to tight tolerancing of both the LED wavelength and dichroic filter. In addition to the triangular grooved structure that reflects light in one plane only, pyramidal arrays (or crossed BEF film) may be used to reflect light in both planes.

For the light collimation optics using both reflection and refraction components, some backwards propagated light rays may pass through the reflection side walls. To catch such light rays, a highly reflective diffusing layer 47 can be wrapped around the reflecting walls without optical contact as shown in FIG. 4B. For example, a triangular profile grooved film (BEF) prism array 49 may be added in close proximity to the LED chip 48 or at the exit of a collimation/collection optic. The film provides recycling of a range of ray angles to increase the apparent brightness of the LED.

The invention claimed is:

1. An LED package comprising:
    an LED chip;
    an edge filter that transmits light emitted from the LED chip having a first angle of incidence or less relative to the LED chip, and reflects light emitted from the LED chip having an angle of incidence relative to the LED chip greater than the first angle of incidence; and
    a diffuser disposed to receive light reflected from the edge filter.

2. The LED package of claim 1, wherein the edge filter is a dichroic edge filter or dichroic mirror.

3. The LED package of claim 1, wherein the edge filter includes a prism array or triangular grooved array.

4. An LED package comprising:
    an LED chip;
    angle dependent light recycling means for transmitting light emitted from the LED chip having a first angle of incidence or less relative to the LED chip, and reflecting light emitted from the LED chip having an angle of incidence relative to the LED chip greater than the first angle of incidence; and
    a diffuser disposed to receive light reflected from the angle dependent light recycling means.

5. The LED package of claim 1, wherein the angle dependent light recycling means is a dichroic edge filter or dichroic mirror.

6. The LED package of claim 1, wherein the angle dependent light recycling means includes a prism array or triangular grooved array.

7. A method of recycling light in an LED package, comprising:
    allowing light emitted from the LED chip to leave the LED package when the light is emitted from the LED chip at a first angle of incidence or less relative to the LED chip;
    keeping the light emitted from the LED chip from leaving the LED package when the light is emitted from the LED chip at an angle of incidence relative to the LED chip greater than the first angle of incidence, and recycling the light back within the LED package as recycled light;
    changing the angle of incidence of the recycled light relative to the LED chip; and
    emitting the recycled light from the LED package at the first angle of incidence or less relative to the LED chip.

8. The method of claim 7, wherein keeping light from leaving the LED package is performed by redirecting the light using a dichroic edge filter or dichroic mirror.

9. The method of claim 7, wherein keeping light from leaving the LED package is performed by redirecting the light using a prism array or triangular grooved array.

10. The method of claim 9, wherein changing the angle of incidence of the recycled light relative to the LED chip is performed by passing the light through a diffuser.

11. The method of claim 8, wherein changing the angle of incidence of the recycled light relative to the LED chip is performed by passing the light through a diffuser.

* * * * *